United States Patent [19]

Smith

[11] 4,137,493
[45] Jan. 30, 1979

[54] BATTERY CHARGE DETECTOR AND CHARGING SYSTEM INCLUDING SUCH DETECTOR

[75] Inventor: Sidney B. Smith, Hemel Hempstead, England

[73] Assignee: Lucas Industries Limited, Great Britain

[21] Appl. No.: 738,550

[22] Filed: Nov. 3, 1976

[30] Foreign Application Priority Data

Nov. 8, 1975 [GB] United Kingdom ............... 46294/75

[51] Int. Cl.² .............................................. H02J 7/04
[52] U.S. Cl. ..................................... 320/39; 328/132; 320/21; 320/48
[58] Field of Search ....................... 320/48, 21, 20, 39, 320/40, 43; 307/358; 328/132

[56] References Cited

U.S. PATENT DOCUMENTS

| 3,805,170 | 4/1974 | Dusheck, Jr. | 328/132 X |
| 3,886,428 | 5/1975 | Macharg | 320/39 |
| 3,938,021 | 2/1976 | Kosmin | 320/40 |
| 3,992,658 | 11/1976 | Bechtold | 320/39 X |

*Primary Examiner*—Robert J. Hickey
*Attorney, Agent, or Firm*—Kane, Dalsimer, Kane, Sullivan and Kurucz

[57] ABSTRACT

A detector, intended particularly for detecting end of charge of a secondary battery under constant current charge, includes a linear input stage producing an output voltage linearly related to the battery voltage. A relay contact is closed periodically by pulses from a clock to connect the output of the input stage to a capacitor and resistor in series. Any change in the output voltage between closure of the contact cause current to flow in the resistor and a comparator compares the voltage across this resistor with a reference voltage. When the battery is charged and the output voltage starts to fall, the negative voltage on the resistor cause the comparator to latch and provide an output signal.

15 Claims, 1 Drawing Figure

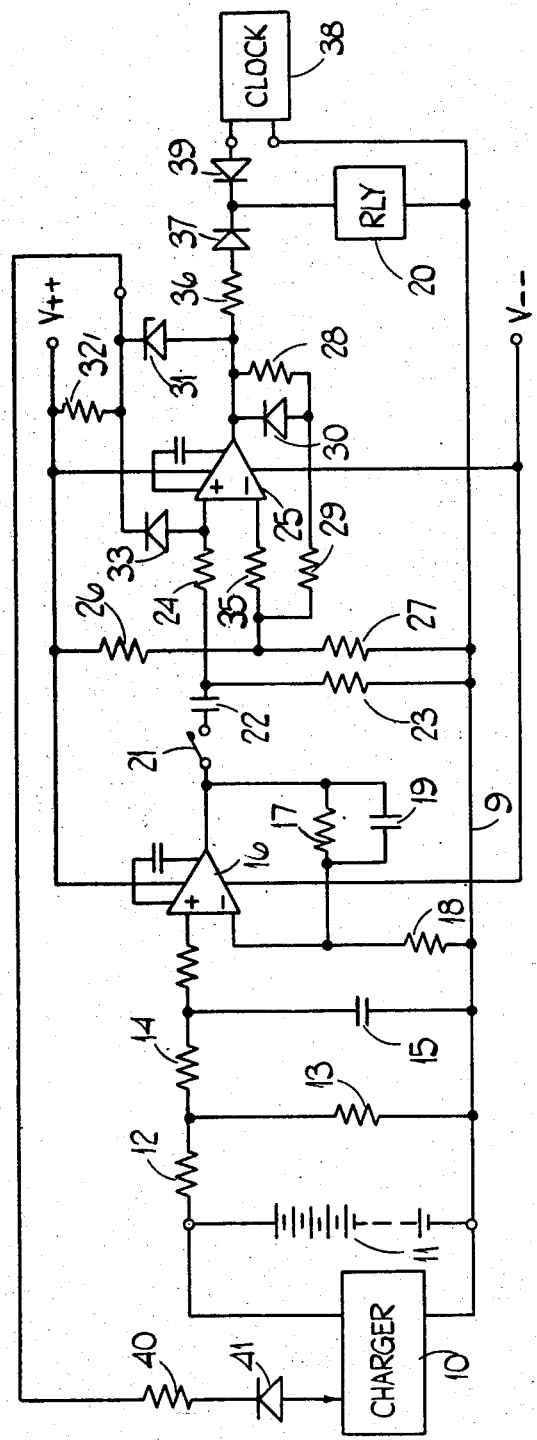

BATTERY CHARGE DETECTOR AND CHARGING SYSTEM INCLUDING SUCH DETECTOR

This invention relates to a detector for use in the control of charging of a secondary battery and also to a battery charging system including such a detector.

The invention results from the realisation that when a battery, particularly a sealed nickel-cadmium battery, is charged by a constant current source the voltage across the battery initially increases but as the battery reaches its fully charged condition the voltage levels off and then starts to fall as the battery is overcharged and its temperature starts to rise.

Broadly, therefore the invention resides in a detector comprising the combination of an input circuit for connection to a battery being charged and producing an output voltage dependent on the battery voltage and detector means sensitive to said output voltage and arranged to provide an output signal when said output voltage starts to fall.

The detector as defined above finds its principle use in constant current charging systems, particularly for sealed nickel cadmium batteries in which substantially all the overcharge current is dissipated as heat. The detector may, however also be used in a constant current charging system for pocket type nickel cadmium batteries and also lead acid batteries in which disassociated gases given off by the electrolyte during overcharging escape instead of being recombined as in sealed batteries so that a lower proportion of the energy is dissipated as heat.

The detector may also be employed in battery charging systems in which the charging current is not directly controlled. In such circumstances the detector is employed to detect thermal runaway. Thermal runaway occurs when the overcharge current through a battery creates sufficient heat for its temperature to rise above a critical value. At this point its terminal voltage begins to fall so that the current rises and the temperature increases again resulting in a current avalanche which will eventually seriously damage the battery.

Preferably said detector means includes a capacitor and a resistor in series, a switch for periodically connecting the input circuit to the capacitor and a comparator for comparing the voltage across the resistor with a reference voltage.

The invention also resides in a battery charging system comprising a current source whereby charging current is applied to the battery, and a detector as defined above monitoring the battery voltage.

Preferably, the detector is connected to operate switch means to discontinue charging when a falling battery voltage is detected.

An example of the invention is shown in the accompanying drawing which shows the circuit diagram of the detector in a constant current battery charging system.

The drawing shows the constant current charger 10 connected across a battery 11 to provide a constant charging current to the battery 11. A voltage divider resistor chain 12, 13 is connected across the battery and the common point of these resistors 12, 13 is connected to a passive filter constituted by a resistor 14 and a capacitor 15. One side of the capacitor 15 is connected to the non-inverting input terminal of an externally compensated operational amplifier 16, having feedback to its inverting input terminal via a voltage divider resistor chain 17, 18 the resistor 17 being bridged by a capacitor 19 to reduce the h.f. gain of the amplifier 16, and the resistor 18 being connected to the ground rail 9.

A relay 20 has a normally open contact 21 which serves to connect the output terminal of the amplifier 16 to one side of a capacitor 22, the other side of which is connected to the rail 9 via a resistor 23. Said other side of the capacitor 22 is also connected by a resistor 24 to the non-inverting input terminal of an operational amplifier 25, the inverting input terminal of which is connected by a resistor 35 to the common point of a voltage divider resistor chain 26, 27 establishing a reference voltage. The operational amplifier 25 has two feedback paths, namely a negative feedback path from the output terminal via a pair of resistors 28, 29 in series, one of which is bridged by a diode 30, to the common point of the resistors 26 amd 27 and a positive feedback path via a zener diode 31 associated with a biasing resistor 32, and a diode 33 to the non-invert input terminal. The anode of the diode 30 is connected to the common point of the resistors 28, 29 and its cathode is connected to the output terminal of the amplifier 25. The zener diode 31 has its anode connected to the output terminal of the amplifier 25 and its cathode connected via the resistor 32 to a positive supply rail, the cathode of the zener diode 31 being also connected to the cathode of the diode 33, which has its anode connected to the non-inverting input terminal of the amplifier 25.

One output signal is taken from the cathode of the zener diode 31. This is applied via a resistor 40 and a diode 41 to a control terminal of the charger 10 to turn off the charger when the voltage at the cathode of zener diode 31 falls. Another output is taken from the output terminal of the amplifier 25 via a resistor 36 and a diode 37 to the relay winding 20. An external clock 38 is also connected via a diode 39 to the relay winding 20.

In use the output of the amplifier 16 is proportional to the voltage across the battery. The amplifier 25 is the comparator of a "sample and hold" circuit which is arranged to periodically sample the output of amplifier 16 and compare its voltage with a reference voltage set by resistors 26, 27. Capacitor 22 stores the previous peak voltage, and at each actuation any change in the voltage during the preceding period causes capacitor charging (or discharging) current to flow through resistor 23. Amplifier (comparator) 25 compares the voltage across this resistor with the voltage set by resistors 26, 27. Whilst the battery voltage is rising it is important that the voltage across storage capacitor 22 is effectively raised to a value representing the voltage of the battery under charge as the latter is periodically sampled. When the battery is fully charged its terminal voltage reaches a peak and eventually starts to fall as it goes into overcharge and its temperature rises. It is the object of the sample and hold circuit to register the peak value of output voltage of amplifier 16 and to initiate a signal when this output voltage has fallen by a predetermined value.

The aforementioned circuit conditions during rising and falling voltages present two requirements. Whilst the battery voltage is rising the capacitor must be cumulatively charged during the sampling pulses so as to accurately reflect the battery terminal voltage. When the end of charge is reached and the battery terminal voltage is falling the capacitor must as far as possible retain its peak charge condition and must not be depleted when sampled. Also the intervals between must be long relative to the sampling pulses to minimise the drain on the capacitor charge. Thus the memory circuit consisting of storage capacitor 22 and resistor 23 is designed to have a long time constant.

Whilst the battery voltage is rising the sampling relay is arranged to latch in for periods considerably in excess of the sampling pulse itself. In practice the relay 20 is operated by a 5 millisecond clock pulse from clock 38 once every 3 minutes. In the early stages of charging whilst the battery voltage is rising a 5 m sec. closing period of the relay contacts 21 would be totally inadequate to allow the storage capacitor 22 to charge fully and thus accurately reflect the battery terminals voltage. Therefore the relay is arranged to latch on through the amplifier 25, resistor 36 and diode 37 until the voltage across resistor 23 (as presented to the non-inverting input of the amplifier) falls to a very small value, i.e. as the charging current of the storage capacitor approaches zero.

As the charging process nears completion and the battery voltage approaches its maximum the increments of capacitor charge become very small. It is still essential that the relay contact 21 is latched on to ensure that the peak voltage condition is registered. This requirement is met as the gain of amplifier 25 is high while the non-inverting input is positive relative to the reference voltage on the inverting input and in this mode very small incremental voltages across resistor 23 are sufficient to latch relay 20. The high resistance of feed-back resistor 28 provides a gain of say, 1000.

When the battery voltage begins to fall, indicating completion of charge, the output voltage from buffer amplifier 16 falls and capacitor 22 begins to discharge during sampling periods. A small negative voltage is now presented to the input of amplifier 25 due to the discharge current in resistor 23. The amplifier output is now negative and diode 30 conducts, short circuiting feed-back resistor 28 so that the gain of amplifier 25 is reduced to a known value of, say, 100.

In this second mode it is important, as stated above, that the storage capacitor retains its peak charge condition and therefore the subsequent sampling periods are limited to the duration of the clock pulse. Decoupling diode 37 ensures that the negative output of amplifier 25 will not operate to latch the relay. When a subsequent negative sample indicates that the battery terminal voltage has fallen below the peak value by a predetermined amount the negative output voltage from amplifier 25 will be sufficient to cause conduction of zener diode 31. For example, a fall of 0.2 volt at the terminals of a 24 volt battery would be represented by 50 millivolts at the output of amplifier 16. For a stage gain of 100 of amplifier 25 a zener breakdown voltage of 5V is required of diode 31.

When this occurs feedback is applied to the non-inverting input of amplifier 25 through diode 33 and the amplifier output is latched to a negative state. At the same time current flow via resistor 40 and diode 41 and operates an inhibitor circuit which terminates the change.

As mentioned above the invention finds its principle application in the control of charging of sealed Nickel-cadmium batteries using a constant current charger, but can also be used in controlled voltage chargers, where the voltage imposed on the battery terminals is controlled with a view to controlling the charging current. Should such a charger be used to charge a lead acid or sealed or pocket type nickel cadmium battery with the control voltage set too high thermal runaway may occur and the detector described above will detect the resulting drop in the terminal voltage and interrupt charging.

I claim:

1. A detector for use in the control of charging of a secondary battery comprising an input circuit for connection to a battery being charged and producing an output voltage dependent on the battery voltage and detector means sensitive to said output voltage and arranged to provide an output signal when said output voltage starts to fall, said detector means comprising a capacitor and a resistor in series, a switch for periodically connecting the input circuit to the capacitor, and a comparator for comparing the voltage across the resistor with a reference voltage.

2. A battery charging system comprising a current source having output terminals connected across a battery, and a detector comprising an input circuit connected across the output terminals of the current source and providing an output voltage dependent on the voltage between said output terminals and detector means sensitive to said output voltage and arranged to provide an output signal when said output voltage starts to fall, the detector means comprising a capacitor and a resistor in series, a switch for periodically connecting the output voltage of the input stage to the capacitor, and a comparator for comparing the voltage across the resistor with a reference voltage.

3. A battery charging system as claimed in claim 2 further comprising means sensitive to said output signal and operating to discontinue supply of current to said output terminals.

4. A battery charging system as claimed in claim 3 in which the switch is a contact of a relay arranged to be energized both by a pulse source and by the output of the comparator, and comprising means for holding the relay energized by the comparator until the capacitor is charged following each pulse from the pulse source.

5. A battery charging system as claimed in claim 4 in which the comparator is in the form of an operational amplifier having a negative feedback path constituted by a pair of resistors in series and a diode connected across one of said resistors so that the gain of the comparator is higher for positive voltage than for negative.

6. A battery charging system as claimed in claim 5 further comprising a resistor for connecting a positive supply rail to the cathode of a diode and to the cathode of a zener diode, the anode of the diode being connected to the non-inverting input terminal of the operational amplifier and the anode of the zener diode being connected to the output terminal of the operational amplifier, so that the comparator latches when the output voltage of the operational amplifier falls to a sufficiently low value to cause breakdown of the zener diode.

7. A battery charging system as claimed in claim 6 in which the means for discontinuing current supply is connected to the cathode of said zener diode so as to discontinue charging when said zener diode conducts.

8. A battery charging system as claimed in claim 2 in which the current source is a constant current source.

9. A detector for use in the control of charging of a secondary battery comprising an input circuit for connection to a battery being charged and producing an output voltage dependent on the battery voltage, dectector means sensitive to said output voltage and arranged to provide an output signal when said output voltage starts to fall, the detector means comprising a capacitor and a resistor in series, a switch for periodically connecting the input circuit to the capacitor, and a comparator for comparing the voltage across the resistor with a reference voltage, said switch being a contact of a relay connected to be driven by a pulse source and by the output of the comparator, and means for holding the relay energized by the comparator until the capacitor is charged following each pulse from said pulse source.

10. A detector as claimed in claim 9 in which the comparator is in the form of an operational amplifier having a negative feedback path constituted by a pair of resistors in series and a diode connected across one of said resistors so that the gain of the comparator is higher for positive output voltage than for negative.

11. A detector as claimed in claim 10 further comprising a resistor connecting a positive supply rail to the cathode of a diode and to the cathode of a zener diode, the anode of the diode being connected to the non-inverting input terminal of the operational amplifier and the anode of the zener diode being connected to the output terminal of the operational amplifier, so that the comparator latches when the output voltage of the operational amplifier falls to a sufficiently low value to cause breakdown of the zener diode.

12. A battery charging system comprising a current source having output terminals connected across a battery, and a detector comprising an input circuit connected across the output terminals of the current source and providing an output voltage dependent on the voltage between said output voltage and arranged to provide an output signal when said output voltage starts to fall, the detector means comprising a capacitor and a resistor in series, a switch for periodically connecting the output voltage of the input stage to the capacitor, and a comparator for comparing the voltage across the resistor with a reference voltage, the switch being a contact of a relay arranged to be energized both by a pulse source and by the output of the comparator, and further comprising means for holding the relay energized by the comparator until the capacitor is charged following each pulse from the pulse source.

13. A battery charging system as claimed in claim 12 in which the comparator is in the form of an operational amplifier having a negative feedback path constituted by a pair of resistors in series and a diode connected across one of said resistors so that the gain of the comparator is higher for positive voltage than for negative.

14. A battery charging system as claimed in claim 13 further comprising a resistor for connecting a positive supply rail to the cathode of a diode and to the cathode of a zener diode, the anode of the diode being connected to the non-inverting input terminal of the operational amplifier, and the anode of the zener diode being connected to the output terminal of the operational amplifier, so that the comparator latches when the output voltage of the operational amplifier falls to a sufficiently low value to cause breakdown of the zener diode.

15. A battery charging system as claimed in claim 12 in which the current source is a constant current source.

* * * * *